United States Patent
Chen et al.

(10) Patent No.: US 6,881,654 B2
(45) Date of Patent: Apr. 19, 2005

(54) SOLDER BUMP STRUCTURE AND LASER REPAIR PROCESS FOR MEMORY DEVICE

(75) Inventors: Kuo-Ming Chen, Hsin-Chu Hsien (TW); Hung-Min Liu, Hsin-Chu (TW)

(73) Assignee: United Electronics Corp., Hsin-Chu (TW)

( * ) Notice: Subject to any disclaimer, the term of this patent is extended or adjusted under 35 U.S.C. 154(b) by 22 days.

(21) Appl. No.: 10/065,568

(22) Filed: Oct. 31, 2002

(65) Prior Publication Data

US 2004/0087129 A1 May 6, 2004

(51) Int. Cl.$^7$ .................. H01L 21/20; H01L 21/4763
(52) U.S. Cl. ............... 438/497; 438/478; 438/612; 438/614
(58) Field of Search .............. 438/497, 478, 438/753, 612–614

(56) References Cited

U.S. PATENT DOCUMENTS

| | | | | |
|---|---|---|---|---|
| 5,977,632 A | * | 11/1999 | Beddingfield | 257/737 |
| 6,118,180 A | * | 9/2000 | Loo et al. | 257/737 |
| 6,162,652 A | * | 12/2000 | Dass et al. | 438/18 |
| 6,395,622 B1 | * | 5/2002 | Liu et al. | 438/497 |
| 6,452,270 B1 | * | 9/2002 | Huang | 257/738 |
| 6,479,376 B1 | * | 11/2002 | Huang et al. | 438/613 |
| 6,528,417 B1 | * | 3/2003 | Wang et al. | 438/665 |
| 6,593,220 B1 | * | 7/2003 | Yu et al. | 438/612 |
| 6,636,313 B1 | * | 10/2003 | Chen et al. | 356/401 |

* cited by examiner

Primary Examiner—Michael Lebentritt
(74) Attorney, Agent, or Firm—Winston Hsu

(57) ABSTRACT

A solder bump structure and laser repair process for memory device include forming a first dielectric layer on a bump pad of a semiconductor wafer. After that, the first dielectric layer is etched to form a contact hole and to expose portions of the bump pad. A second dielectric layer is then formed on a surface of the semiconductor wafer outside of the contact hole. An under bump metallurgy (UBM) process is performed to form a metal layer on a surface of the contact hole, and a solder bump is formed on the metal layer. Finally, the laser repair process for memory device is completed.

9 Claims, 8 Drawing Sheets

SOLDER BUMP STRUCTURE AND LASER REPAIR PROCESS FOR MEMORY DEVICE

BACKGROUND OF INVENTION

1. Field of the Invention

The present invention relates to a process of performing a laser repair process for memory device after formation of a solder bump.

2. Description of the Prior Art

High performance microelectronic devices often use solder balls or solder bumps for electrical and mechanical interconnection to other microelectronic devices. For instance, an ultra large scale integration (ULSI) chip may be electrically connected to a circuit board or other second stage packaging substrate by using solder balls or solder bumps. This connection technology is also referred to as "Flip-chip packaging, FC" technology.

Please refer to FIG. 1 to FIG. 4 of schematic views of performing a laser repair process for memory device on a semiconductor wafer 10 according to a prior art method. As shown in FIG. 1, the semiconductor wafer 10 comprises a substrate 12, which has an integrated circuit region (not shown) comprising an embedded memory array formed on its surface. The surface of the substrate 12 further comprises a bump pad 14, a plurality of fuses 16, and an alignment key 18. The bump pad 14 is electrically connected with the integrated circuit region. Therefore, after completing a subsequent packaging process, the integrated circuit is able to electrically connect to an external circuit through the bump pad 14. The fuses 16 are formed on an upper layer of the integrated circuit region and electrically connected with the embedded memory, and after finding invalid memory cells, word lines, or conducting wires within the embedded memory by performing a circuit probing process, a laser repair process is performed to eliminate these invalid elements by cutting off the corresponding fuses.

The prior art method is first forming a first dielectric layer 20 on the surface of the semiconductor wafer 10, which completely covers the bump pad 14 and the fuses 16. The first dielectric layer 20 is also called a passivation layer and is used to seal up and to avoid moistness. Thereafter, a photo-etching-process (PEP) is performed to form a contact hole 21 in the first dielectric layer 20 above the bump pad 14 so as to expose portions of the bump pad 14. Because a subsequent laser repair process uses laser beams to penetrate and to cut off portions of the fuses 16, the first dielectric layer 20 must be composed of transparent materials. As shown in FIG. 2, a circuit probing process is then performed, which uses a probing tip (not shown) electrically connected to the bump pad 14 to find invalid memory cells, word lines, or conducting wires within the embedded memory in the integrated circuit region, and the alignment key 18 is used to define the regions needed to accept laser repair. After that, an accurate laser zip process is performed to cut off portions of the fuses 16 in the regions defined by the alignment key 18 so as to destroy electrical connections of these invalid elements.

As shown in FIG. 3, a second dielectric layer 22 composed of benzocyclobutene (BCB), polyimide (PI), or BCB+PI is formed on the surface of the semiconductor wafer 10. Then, as shown in FIG. 4, an under bump metallurgy (UBM) process is performed to form a metal layer 24, which is composed of specific multi-layer metal films, on a surface of the contact hole 21 by sputtering. The functions of the metal layer 24 comprise providing adhesion and diffusion barrier, improving moistness of the bump pad 14, and preventing oxidation. A solder bump 26 is then formed on the metal layer 24 corresponding to the contact hole 21 by evaporating, printing, electro-plating, dipping, or ultrasonic soldering. Finally, the semiconductor wafer 10 is placed on a packaging board (not shown), and the solder bump 26 melted by a thermal treatment generates surface tension to connect the semiconductor wafer 10 and the packaging board.

The prior art method causes several problems as a result of performing the circuit probing and laser repair process before forming the second dielectric layer 22 and the metal layer 24. First, the circuit probing process using the probing tip directly connected to the bump pad 14 may form a serious probing mark on a surface of the bump pad 14. Because the metal layer 24 formed on the surface of the bump pad 14 has poor step coverage, the probing mark on the surface of the bump pad 14 may cause the metal layer 24 to lose or reduce its functions of providing adhesion and diffusion barrier. Additionally, when an interconnect system uses a cooper process and low-k materials as insulation layers, the circuit probing process directly performed on the bump pad 14 may result in bare copper or crack insulation layers because of excess probing force. As well, oxidation of the probing mark on the surface of the bump pad 14 is a difficult problem.

Furthermore, because the laser repair process performed after the circuit probing process cuts off portions of the fuses 16, a plurality of trenches 27 with high aspect ratio are formed on the surface of the semiconductor wafer 10. When filling the trenches 27 with the second dielectric layer 22, some voids may be formed in the second dielectric layer 22 and affect the reliability of products.

SUMMARY OF INVENTION

It is therefore a primary object of the claimed invention to provide a solder bump structure and laser repair process for memory device for solving the above-mentioned problems.

According to the claimed invention, a solder bump structure and laser repair process for memory device comprise forming a first dielectric layer on a bump pad of a semiconductor wafer. After that, the first dielectric layer is etched to form a contact hole and to expose portions of the bump pad. A second dielectric layer is then formed on a surface of the semiconductor wafer outside of the contact hole. An under bump metallurgy (UBM) process is performed to form a metal layer on a surface of the contact hole, and a solder bump is formed on the metal layer. Finally, the laser repair process for memory device is completed.

The solder bump structure and laser repair process for memory device according to the claimed invention comprise first performing an UBM process and forming a solder bump, and then performing a circuit probing process through the solder bump. Finally, the laser repair process is performed. Therefore, the quality of the metal layer formed on a surface of the bump pad and the structure of electronic devices on the semiconductor wafer avoid being damaged by the circuit probing process. Additionally, the claimed invention also prevents the formation of the voids in the second dielectric layer, which affects the reliability of products.

These and other objectives of the claimed invention will no doubt become obvious to those of ordinary skill in the art after reading the following detailed description of the preferred embodiment, which is illustrated in the multiple figures and drawings.

DETAILED DESCRIPTION

Figure 1:
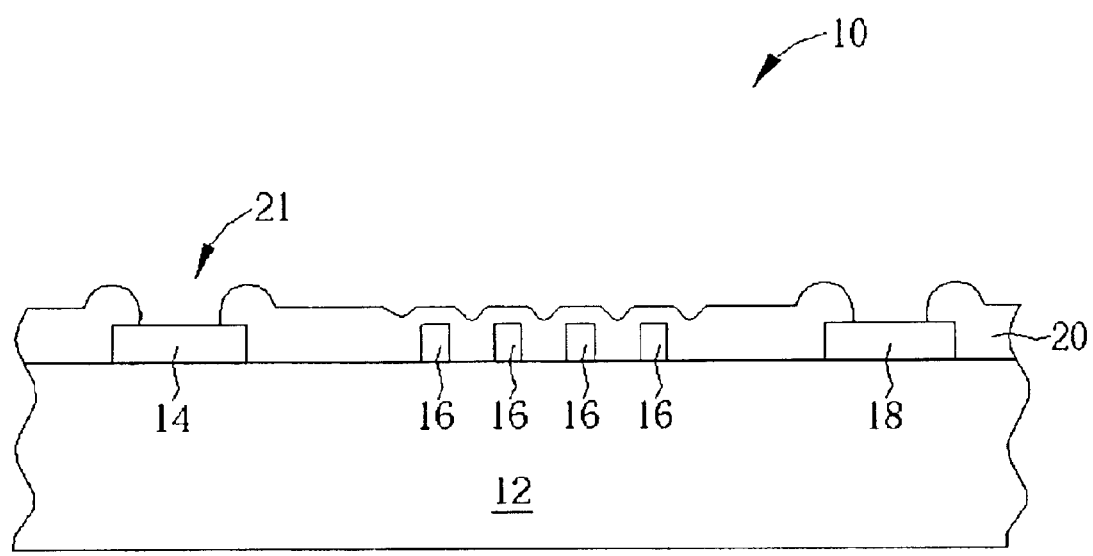
FIG. 1 to FIG. 4 are schematic views of performing a laser repair process for memory device on a semiconductor wafer according to a prior art method.
Figure 2:
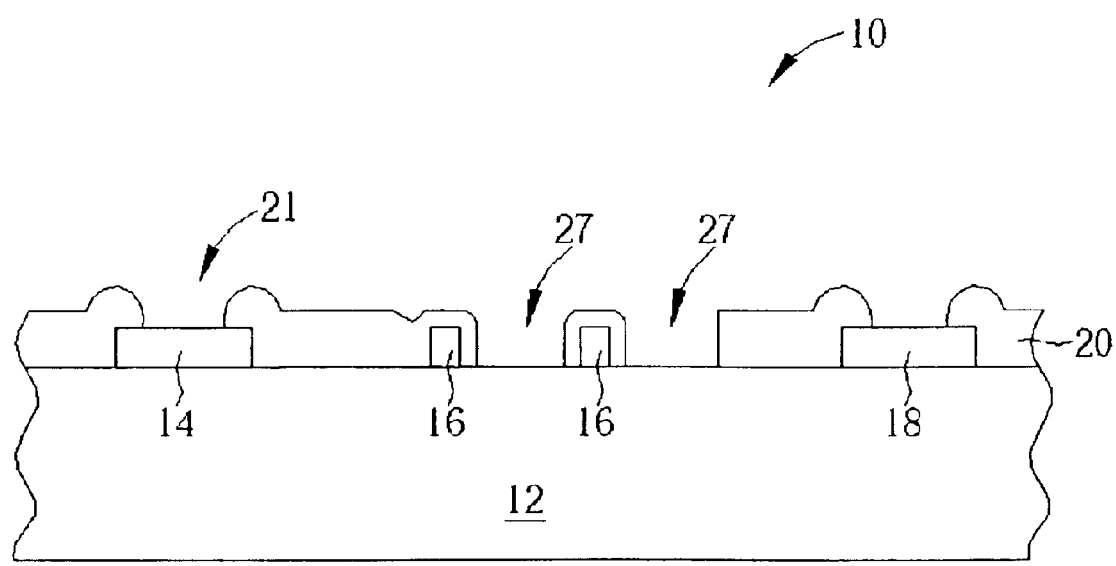
Figure 3:
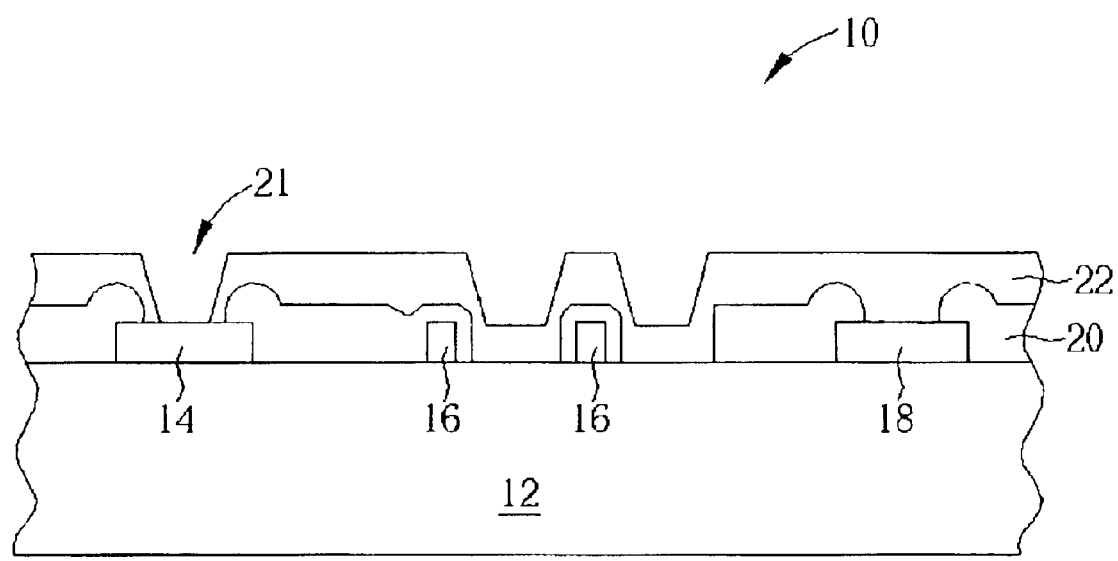
Figure 4:
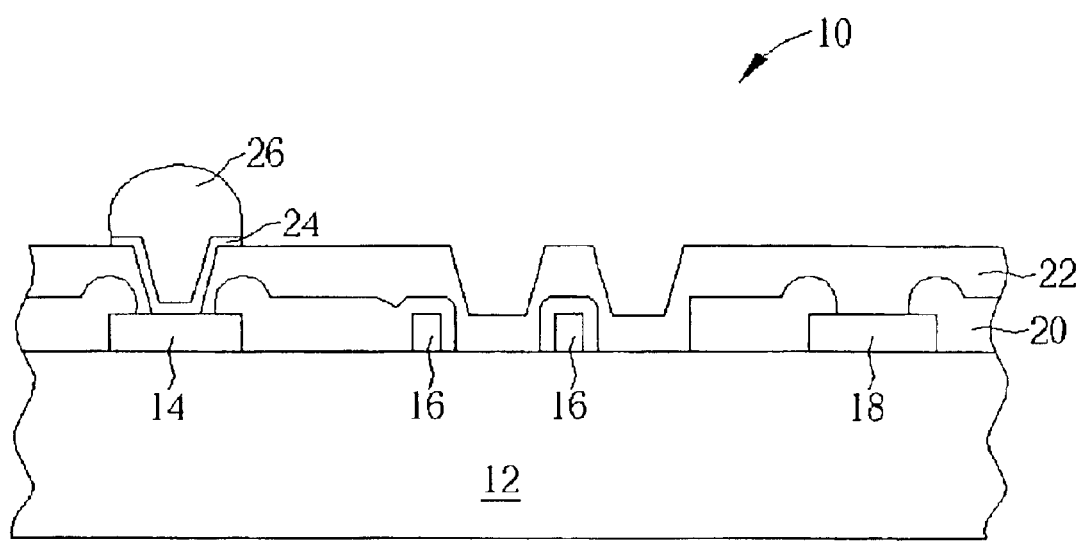
Figure 5:
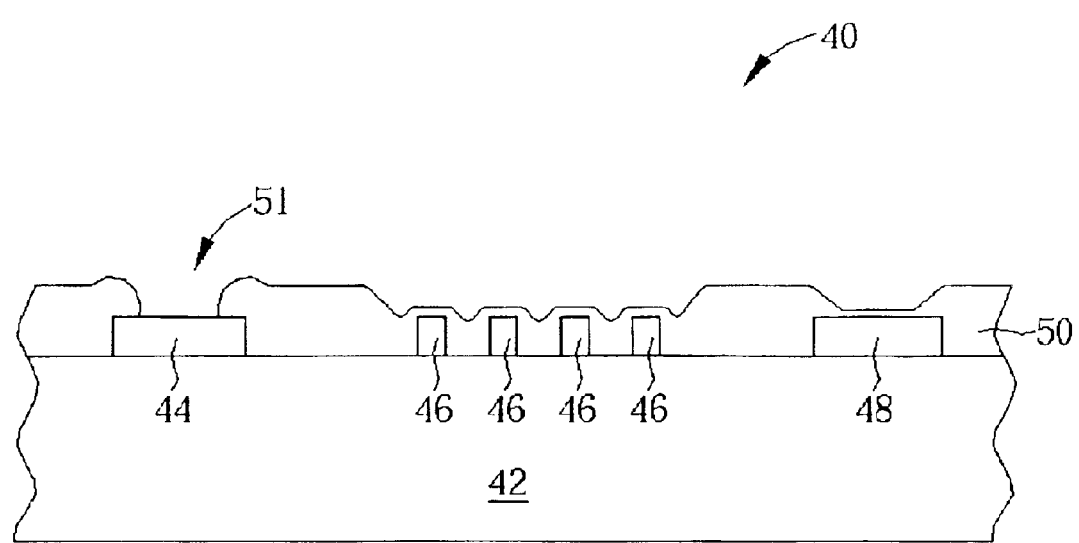
FIG. 5 to FIG. 7 are schematic views of forming a solder structure and performing a laser repair process for memory device on a semiconductor wafer according to a first embodiment of the present invention.
Figure 6:
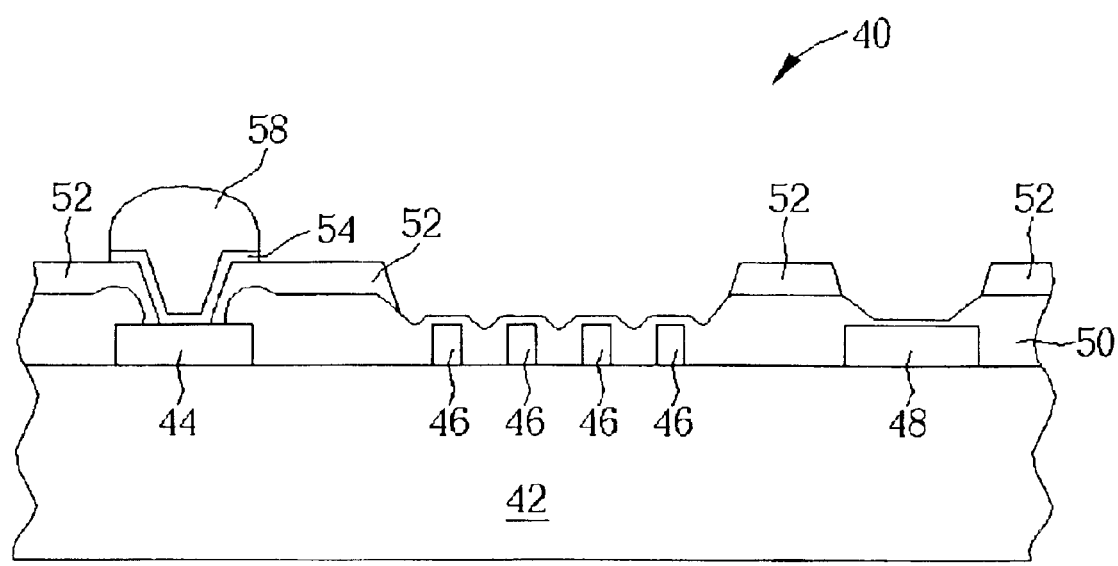
Figure 7:
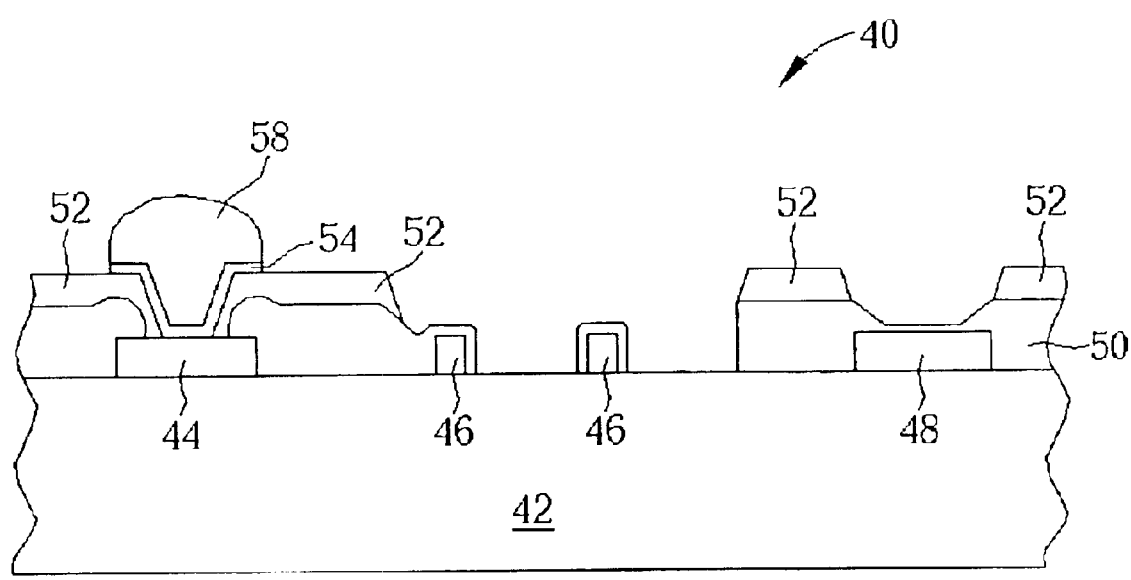

Please refer to FIG. 5 to FIG. 7 of schematic views of forming a solder structure and performing a laser repair process for memory device on a semiconductor wafer 40 according to a first embodiment of the present invention. As shown in FIG. 5, the semiconductor wafer 40 comprises a substrate 42, which has an integrated circuit region (not shown) comprising an embedded memory array formed on its surface. The surface of the substrate 42 further comprises a bump pad 44, a plurality of fuses 46, and an alignment key 48, and a silicon oxide layer (not shown) is formed on surfaces of the fuses 46 and the alignment key 48. The bump pad 44 is electrically connected with the integrated circuit region. Therefore, after completing a subsequent packaging process, the integrated circuit is able to electrically connect to an external circuit through the bump pad 44. The fuses 46 are formed on an upper layer of the integrated circuit region and electrically connected with the embedded memory, and after finding invalid memory cells, word lines, or conducting wires within the embedded memory by performing a circuit probing process, a laser repair process is performed to eliminate these invalid elements by cutting off the corresponding fuses.

The present invention is first forming a first dielectric layer 50 on the surface of the semiconductor wafer 40, which completely covers the bump pad 44 and the fuses 46. Thereafter, a photo-etching-process (PEP) is performed to form a contact hole 51 in the first dielectric layer 50 above the bump pad 44 so as to expose portions of the bump pad 44. As shown in FIG. 6, a second dielectric layer 52 composed of benzocyclobutene (BCB), polyimide (PI), or BCB+PI is formed on the surface of the semiconductor wafer 40 followed by performing an etching process to remove portions of the second dielectric layer 52 formed on the surface of the contact hole 51, the fuses 46, and the alignment key 48.

An under bump metallurgy (UBM) process is then performed to form a metal layer 54, which is composed of specific multi-layer metal films, on the surface of the contact hole 51 by sputtering. The functions of the metal layer 54 comprise providing adhesion and diffusion barrier, improving moistness of the bump pad 44, and preventing oxidation. A solder bump 58 is then formed on the metal layer 54 corresponding to the contact hole 51 by evaporating, printing, electro-plating, dipping, or ultrasonic soldering.

As shown in FIG. 7, a circuit probing process is performed, which uses a probing tip (not shown) electrically connected to the solder bump 58 to find invalid memory cells, word lines, or conducting wires within the embedded memory in the integrated circuit region, and the alignment key 48 is used to define regions needed to accept laser repair. After that, an accurate laser zip process is performed to cut off portions of the fuses 46 in the regions defined by the alignment key 48 so as to destroy electrical connections of these invalid elements. Finally, the semiconductor wafer 40 is placed on a packaging board (not shown) after completing the above-mentioned laser repair process, and the solder bump 58, melted by a thermal treatment, generates surface tension to connect the semiconductor wafer 40 and the packaging board.

Figure 8:
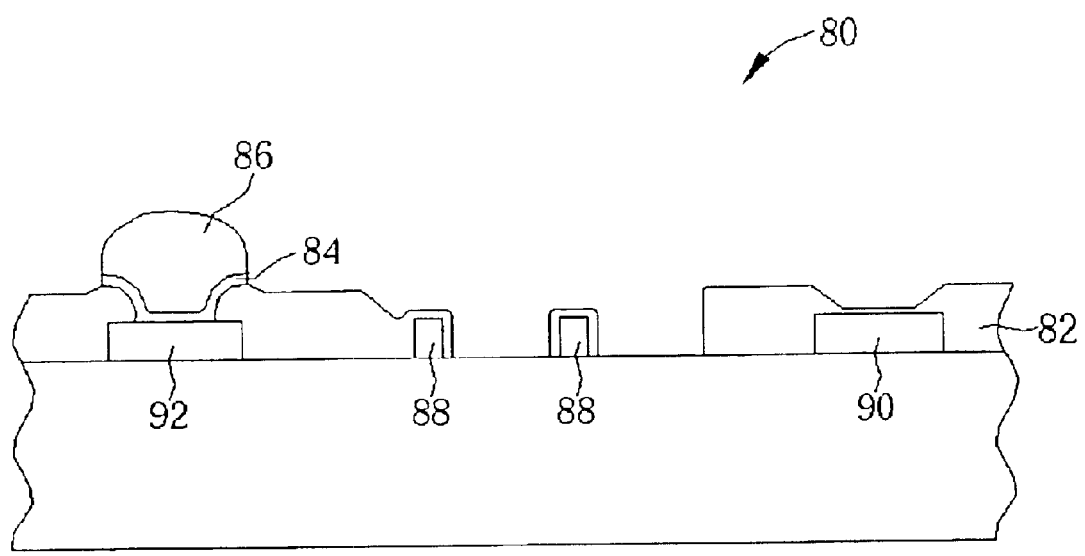
FIG. 8 is a schematic view of forming a solder structure and performing a laser repair process for memory device on a semiconductor wafer according to a second embodiment of the present invention.

Please refer to FIG. 8 of a schematic view of forming a solder structure and performing a laser repair process for memory device on a semiconductor wafer according to a second embodiment of the present invention. In this embodiment of the present invention, after forming the first dielectric layer 82 and the contact hole on the surface of the semiconductor wafer 80, the UBM process can be directly performed to form a metal layer 84 on the surface of the contact hole by sputtering. Therefore, the process of forming the second dielectric layer 52 in the first embodiment of the present invention is omitted. After forming the metal layer 84, the following processes, just like the first embodiment of the present Invention, comprise forming a solder bump 86 on the metal layer 84 corresponding to the contact hole, performing a circuit probing process through the solder bump 86, and performing a laser repair process to cut off portions of the fuses 88. Finally, the semiconductor wafer 80 is placed on a packaging board (not shown) and connected with the packaging board by performing a thermal treatment.

After forming a first dielectric layer, a contact hole, and a second dielectric layer on a surface of a semiconductor wafer, the present invention first performs an UBM process and forms a solder bump. Thereafter, a circuit probing process is performed through the solder bump. Finally, a laser repair process is performed.

In contrast to the prior art method, a solder structure and laser repair process for memory device of the present invention performs the circuit probing process by connecting the probing tip with the solder bump instead of the bump pad. Therefore, the quality of the metal layer formed on a surface of the bump pad and the structure of electronic devices of the semiconductor wafer avoid being damaged by the circuit probing process. Additionally, the present invention also prevents the formation of voids resulting from the laser repair process forming trenches on the semiconductor wafer, which affects the reliability of products.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A solder bump structure and laser repair process for memory device, comprising:

providing a semiconductor wafer, which comprises a substrate, an integrated circuit, and at least one bump pad and a plurality of fuses formed on the substrate and electrically connected with the integrated circuit;

forming a first dielectric layer on a surface of the bump pad;

performing an etching process to form a contact hole in the first dielectric layer and to expose a portion of the bump pad;

forming a second dielectric layer on a surface of the semiconductor wafer outside of the contact hole;

performing an under bump metallurgy (UBM) process so as to form a metal layer on a surface of the contact hole;

forming a solder bump on the metal layer corresponding to the contact hole;

performing a circuit probing process through the solder bump and a laser repair process to cut off portions of the fuses after the formation of the solder bump, the circuit probing process using a probing tip electrically connecting with the solder bump; and performing a connection process to complete connection of the semiconductor wafer and a packaging board.

2. The solder bump structure and laser repair process for memory device of claim 1 wherein the semiconductor wafer further comprises:

at least one alignment key; and a silicon oxide layer formed on a surface of the fuses and the alignment key.

3. The solder bump structure and laser repair process for memory device of claim 2 wherein the method of forming the second dielectric layer on the surface of the semiconductor wafer outside of the contact hole comprises:

forming the second dielectric layer on the surface of the semiconductor wafer; and performing a photo-etching-process (PEP) to remove portions of the second dielectric layer formed on the surface of the contact hole, the fuses, and the alignment key.

4. The solder bump structure and laser repair process for memory device of claim 2 wherein the integrated circuit further comprises an embedded memory array.

5. The solder bump structure and laser repair process for memory device of claim 1 wherein the second dielectric layer is composed of insulating materials such as benzocyclobutene (BCB), polyimide (PI), and BCB+PI.

6. A solder bump structure and laser repair process for memory device, comprising;

providing a semiconductor wafer, which comprises a substrate, an integrated circuit, and at least one bump pad and a plurality of fuses formed on the substrate and electrically connected with the integrated circuit;

forming a dielectric layer on a surface of the bump pad;

performing an etching process to form a contact hole in the dielectric layer and to expose a portion of the bump pad;

performing an under bump metallurgy (UBM) process so as to form a metal layer on a surface of the contact hole;

forming a solder bump on the metal layer corresponding to the contact hole;

performing a circuit probing process through the solder bump and a laser repair process to cut off portions of the fuses after the formation of the solder bump, the circuit probing process using a probing tip electrically connecting with the solder bump; and performing a connection process to complete connection of the semiconductor wafer and a packaging board.

7. The solder bump structure and laser repair process for memory device of claim 6 wherein the semiconductor wafer further comprises:

at least one alignment key; and a silicon oxide layer formed on a surface of the fuses and the alignment key.

8. The solder bump structure and laser repair process for memory device of claim 7 wherein the integrated circuit further comprises an embedded memory array.

9. A solder bump structure and laser repair process for memory device, comprising:

providing a semiconductor wafer, which comprises a substrate, an integrated circuit, and at least one bump pad and a plurality of fuses formed on the substrate and electrically connected with the integrated circuit;

forming a first dielectric layer on a surface of the bump pad;

performing an etching process to form a contact hole in the first dielectric layer and to expose a portion of the bump pad;

forming a second dielectric layer on a surface of the semiconductor wafer outside of the contact hole;

performing an under bump metallurgy process so as to form a metal layer on a surface of the contact hole;

forming a solder bump on the metal layer corresponding to the contact hole;

performing a circuit probing process through the solder bump and a laser repair process to cut off portions of the fuses after the formation of the solder bump and the second dielectric layer, the circuit probing process using a probing tip electrically connecting with the solder bump; and performing a connection process to complete connection of the semiconductor wafer and a packaging board.

* * * * *

UNITED STATES PATENT AND TRADEMARK OFFICE
CERTIFICATE OF CORRECTION

PATENT NO. : 6,881,654 B2
DATED : April 19, 2005
INVENTOR(S) : Chen et al.

It is certified that error appears in the above-identified patent and that said Letters Patent is hereby corrected as shown below:

<u>Title page,</u>
Item [73], Assignee, please delete "United Electronics Corp." and add
-- United Microelectronics Corp. --.

Signed and Sealed this

Sixteenth Day of August, 2005

JON W. DUDAS
*Director of the United States Patent and Trademark Office*